(12) United States Patent
Nakada

(10) Patent No.: US 10,770,285 B2
(45) Date of Patent: Sep. 8, 2020

(54) SILICON MEMBER AND METHOD OF PRODUCING THE SAME

(71) Applicant: MITSUBISHI MATERIALS CORPORATION, Tokyo (JP)

(72) Inventor: Yoshinobu Nakada, Ageo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/227,189

(22) Filed: Mar. 27, 2014

(65) Prior Publication Data
US 2014/0291680 A1 Oct. 2, 2014

(30) Foreign Application Priority Data

Mar. 28, 2013 (JP) .................. 2013-067952

(51) Int. Cl.
| | | |
|---|---|---|
| H01L 21/02 | (2006.01) | |
| H01L 29/02 | (2006.01) | |
| H01L 29/04 | (2006.01) | |
| F27B 14/06 | (2006.01) | |
| H01L 23/00 | (2006.01) | |

(52) U.S. Cl.
CPC ........ *H01L 21/02123* (2013.01); *F27B 14/06* (2013.01); *H01L 21/02238* (2013.01); *H01L 21/02247* (2013.01); *H01L 23/562* (2013.01); *H01L 29/02* (2013.01); *H01L 29/04* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 4,298,629 A | * | 11/1981 | Nozaki | ............ H01L 21/3185 |
| 5,759,426 A | * | 6/1998 | Kobayashi | ........ C04B 41/5066 |
| | | | | 134/1.3 |
| 6,431,183 B1 | * | 8/2002 | Konishi | ................. C01B 13/10 |
| | | | | 134/1.3 |

(Continued)

FOREIGN PATENT DOCUMENTS

| | | |
|---|---|---|
| CN | 102881590 A | 1/2013 |
| EP | 1615261 A1 | 1/2006 |

(Continued)

OTHER PUBLICATIONS

Zhu et al., "Thermal nitridation kinetics of silicon wafer in nitrogen atmosphere during annealing," Mar. 2005, Thin Solid Films, vol. 474, Issues 1-2, pp. 326-329.*

(Continued)

*Primary Examiner* — Shaun M Campbell
*Assistant Examiner* — Aneta B Cieslewicz
(74) *Attorney, Agent, or Firm* — Locke Lord LLP

(57) ABSTRACT

A silicon member and a method of producing the silicon member are provided. Cracking is suppressed in the silicon member even if the silicon member is used in a condition where it is heated. The silicon member 10 includes a coating layer 11 that coats a surface of the silicon member 10, wherein the coating layer 11 is composed of a product of silicon formed by reaction of the silicon on the surface, and a thickness of the coating layer is 15 nm or more and 600 nm or less. It is preferable that the coating layer is a silicon oxide film or a silicon nitride film.

6 Claims, 6 Drawing Sheets

(56) References Cited

U.S. PATENT DOCUMENTS

| | | | |
|---|---|---|---|
| 6,797,323 B1* | 9/2004 | Kashiwagi | H01L 21/02238 257/E21.285 |
| 2002/0119641 A1* | 8/2002 | Zehavi | H01L 21/324 438/458 |
| 2004/0173948 A1* | 9/2004 | Pandelisev | 264/500 |
| 2005/0170307 A1* | 8/2005 | Adachi | F27D 5/0037 432/253 |
| 2005/0229842 A1* | 10/2005 | Umeno et al. | 117/84 |
| 2007/0075403 A1* | 4/2007 | Sakashita et al. | 257/626 |
| 2007/0169684 A1* | 7/2007 | Stoddard | 117/13 |
| 2007/0292814 A1* | 12/2007 | Sasajima | H01L 21/67109 432/5 |
| 2009/0186489 A1* | 7/2009 | Nakamura et al. | 438/770 |
| 2013/0341622 A1* | 12/2013 | Takamura | C01B 33/037 257/49 |

FOREIGN PATENT DOCUMENTS

| | | |
|---|---|---|
| JP | H08148552 A | 6/1996 |
| JP | 2002542621 A | 12/2002 |
| JP | 2003173982 A | 6/2003 |
| JP | 2007099536 A | 4/2007 |
| JP | 2008-138986 A | 6/2008 |
| JP | 2009523693 A | 6/2009 |
| JP | 2010259160 A | 11/2010 |
| WO | 200063952 A1 | 10/2000 |
| WO | 200159826 A1 | 8/2001 |
| WO | 2004030073 A1 | 4/2004 |
| WO | 2004073057 A1 | 8/2004 |
| WO | 2004090967 A1 | 10/2004 |
| WO | 2007084934 A2 | 7/2007 |

OTHER PUBLICATIONS

European Search Report dated Sep. 29, 2014, issued for the European patent application No. 14161925.4.
Office Action dated Jun. 6, 2017 issued by Examiner Kazuki Suzuki, for corresponding Japanese Patent Application No. 2014-068909.
Office Action dated May 12, 2017 issued for corresponding Chinese Patent Application No. 201410119659.9.

* cited by examiner

SILICON MEMBER AND METHOD OF PRODUCING THE SAME

BACKGROUND OF THE INVENTION

1. Field of the Invention

The present invention relates to a silicon member, which is placed in a semiconductor manufacturing apparatus, a heat treatment apparatus, or the like, and used in a condition where it is heated, and a method of producing the silicon member.

Priority is claimed on Japanese Patent Application No. 2013-067952, filed Mar. 28, 2013, the contents of which are incorporated herein by reference.

2. Description of Related Art

Conventionally, when panels such as the liquid crystal are manufactured, the deposition treatment or the heat treatment is performed on the panels occasionally. In the deposition and heat treatments, a holding plate for holding the panel is needed. Conventionally, quartz, which is inexpensive and has excellent heat resistance, has been used as the holding plate. However, quartz has a poor thermal conductivity; making it difficult for the entire panel to be heated evenly. Therefore, usage of quartz as the holding plate causes a deteriorate in-plate uniformity, which leads to possible reduction of quality and yield. In addition, in order to improve quality by equalizing the temperature within a predetermined range, it is necessary to set a longer period of time for the pre-deposition process and the heat treatment itself, which leads to a reduced productivity.

For example, in order to circumvent the above-mentioned problem, usage of silicon plate as the holding plate for holding panels is disclosed recently in Patent Literature 1 (PTL 1) (Japanese Unexamined Patent Application, First Publication No. 2008-138986). Since thermal conductivity of the silicon plate is higher than that of quartz, the overall temperature uniformity is improved. Thus, usage of the silicon plate has advantages, such as characteristics at the central and outer peripheral parts being almost equal, during manufacturing a large-sized panel.

Also, in addition to the above-mentioned silicon plate, large numbers of silicon members which are used in the condition where they are heated at a high temperature, such as the silicon ring material, silicon disc material, silicon plate material, or the like placed in the semiconductor manufacturing apparatus, and the silicon-made rectangular pillar material, bar material, bulk material, or the line used in the heat treatment apparatus, are provided. One of the reasons for the usage of them is that the silicon members have a higher thermal conductivity than quartz-made members.

SUMMARY OF THE INVENTION

Problems to be Solved by the Invention

Speaking of the above-described silicon member, there are scratches and micro-cracks due to grinding, polishing, or the like, on its surface. Thus, the silicon member has a shortcoming of forming cracks originated on these scratches and micro-cracks when a small load is applied. Also, there is a possibility that the silicon member is cracked by thermal stress during beating. When the silicon member is a silicon plate or the like whose side is 500 mm or more, particularly when it is a large-sized silicon member such as a silicon plate or the like whose side is 1000 mm or more, the above-mentioned thermal stress becomes significantly high, and it is likely to be cracked.

The present invention is made under circumstances described above. The purpose of the present invention is to provide a silicon member with a lower occurrence of cracking even if it is used in a condition where it is heated, and a method of producing the silicon member. The temperature in condition where the silicon member is heated means a temperature ranged from 300° C. to 1100° C.

Means for Solving the Problem

In order to solve the problem to achieve the purpose, the present invention has aspects described below. An aspect of the present invention is a silicon member that is used in a condition where the silicon member is heated, the silicon member including a coating layer that coats a surface of the silicon member with micro-cracks, wherein the coating layer is composed of a product of silicon formed by reaction of the silicon on the surface, and a thickness of the coating layer is 15 nm or more and 600 nm or less.

In the silicon member configured as described above, the coating layer is composed of a product of silicon formed by reaction of the silicon on the surface, and a thickness of the coating layer is 15 nm or more and 600 nm or less. Thus, scratches and micro-cracks having existed on the surface of the silicon member are eliminated in the process the coating layer is formed. Therefore, the cracking originated from these scratches and micro-cracks can be suppressed.

In the first aspect of the present invention, the coating layer may be a silicon oxide film.

In this case, the scratches and micro-cracks having existed on the surface of the silicon member can be eliminated by forming the silicon oxide film by oxidation-treating the surface of the silicon member. Therefore, the cracking originated from these scratches and micro-cracks can be suppressed.

As a method for the oxidation treatment, various methods, such as dry oxidation, wet oxidation, vacuum oxidation, pressuring oxidation, halogen oxidation, ozone oxidation, and the like, can be used.

In the aspect described above, a thickness of the silicon dioxide film may be 30 nm or more and 520 nm or less.

In this case, the scratches and micro-cracks having existed on the surface of the silicon member can be eliminated sufficiently even if the micro-cracks are deep, since the thickness of the silicon oxide film is 30 nm or more. Also, since the thickness of the silicon oxide film is 520 nm or less, the lapse time for the oxidation treatment can be shortened, leading to more efficient productivity of the silicon member.

Also, in the silicon member of the aspect of the present invention, the coating layer may be a silicon nitride film.

In this case, the scratches and micro-cracks having existed on the surface of the silicon member can be eliminated by forming the silicon nitride film by nitridation-treating the surface of the silicon member. Therefore, the cracking originated from these scratches and micro-cracks can be suppressed.

As a method for the nitridation treatment, the thermal nitridation method can be used. As a method for depositing a nitride film, various methods, such as LPCVD method, the plasma CVD method, and the like, can be used.

Other aspect of the present invention is a silicon member that is used in a condition where the silicon member is heated, wherein after thrilling a coating layer composed of a product of silicon formed by reaction of the silicon on a surface of the silicon member, the surface is exposed by removing the coating layer. In addition to the above-described oxide film and nitride film, a silicon carbide (SiC) film can be used as the coating layer composed of the product of silicon.

In the silicon member configured as described above, scratches and micro-cracks having existed on the surface of the silicon member disappear in the process the coating layer is formed since the coating layer composed of the product of silicon is formed by reaction of the silicon on a surface of the silicon member. And, since the coating layer is removed, a silicon member free of a scratch and a micro-cracking can be obtained. Also, contamination of impurities from the coating layer (product of silicon) to other members or the like can be prevented during the usage under the high-temperature condition.

Other aspect of the present invention is a silicon member that is used in a condition where the silicon member is heated, wherein after forming a coating layer composed of a product of silicon formed by reaction of the silicon on a surface of the silicon member, the surface is exposed by removing the coating layer, and a coating layer composed of a product of silicon is re-formed on the exposed surface. The reason for re-forming the new coating layer composed of a product of silicon on the exposed silicon surface after forming the old coating layer composed of a product of silicon and removing it to expose the surface of the silicon member is as follows. When both sides are etched by a mixed liquid of hydrofluoric acid and nitric acid after polishing surfaces of the silicon plate material with a polishing machine, there are impurity elements on the silicon surface washed by pure water. In case of the coating layer being formed in the state, the impurity elements originated from polishing remain in the coating layer as they are. When it is heated as a substrate of a panel or the like in the state where the impurity elements are included in the coating layer there is a possibility that the impurities included in the coating layer are transferred to the panel or the like to contaminate the panel or the like. Therefore, when the acceptable level of impurity for the panel or the like is even lower, it is preferable to re-form the new coating layer composed of a product of silicon after removing the old coating layer with the impurities in order to reduce the contamination originated from the coating layer.

In the silicon member configured as described above: formation of scratches on the surface of the coating layer can be prevented. Alternatively, even if micro-scratches are formed after removal of the old coating layer, they can be eliminated. Therefore, cracking originated from those scratches can be suppressed.

Other aspect of the present invention is a silicon member that is used in a condition where the silicon member is heated, wherein a strained-layer on a surface layer is removed and a calculated average roughness Ra is 2 nm or less by polishing and etching a surface of the silicon member.

In the silicon member configured as described above, scratches and micro-cracks on the surface of the silicon member are eliminated since a strained-layer on a surface layer is removed and a calculated average roughness Ra is 2 nm or less by polishing and etching a surface of the silicon member. Thus, cracking originated from these scratches and micro-cracks can be suppressed.

The silicon member of one of aspects of the present invention may be made of a poly-crystalline silicon. Alternatively, it may be made of a pseudo-single-crystalline silicon.

Furthermore, a dimension of the silicon member of one of aspects of the present invention may be: width W is 500 mm to 1500 mm; length is 500 mm to 1500 mm; and thickness is 5 mm to 50 mm.

Other aspect of the present invention is a method of producing a silicon member that is used in a condition where the silicon member is heated, the method including the step of forming a coating layer composed of a product of silicon formed by reaction of the silicon on a surface of the silicon member.

The step of forming a coating layer may be a step of oxidation treating. Alternatively, the step of forming a coating layer may be a step of nitridation treating.

Furthermore, the method further may include a step of removing the coating layer formed in the step of forming a coating layer. Also, the method further may include a step of re-forming a coating layer on a silicon surface exposed in the step of removing the coating layer.

Effects of the Invention

As explained above, according to the present invention, a silicon member with an infrequent occurrence of cracking even if it is used in a condition where it is heated, and a method of producing the silicon member are provided.

EMBODIMENTS OF THE INVENTION

Figure 1:
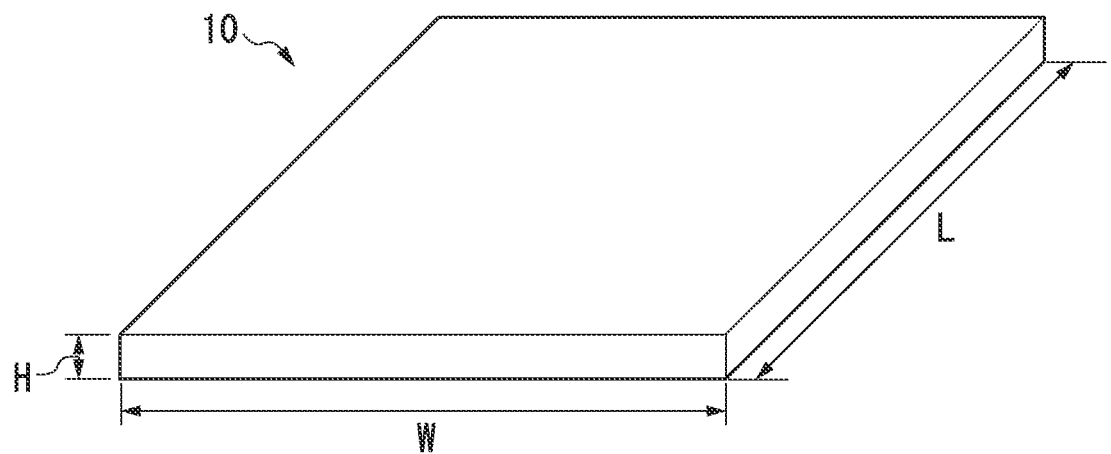
FIG. 1 is a perspective view of the silicon member of the first embodiment of the present invention.
Figure 2:
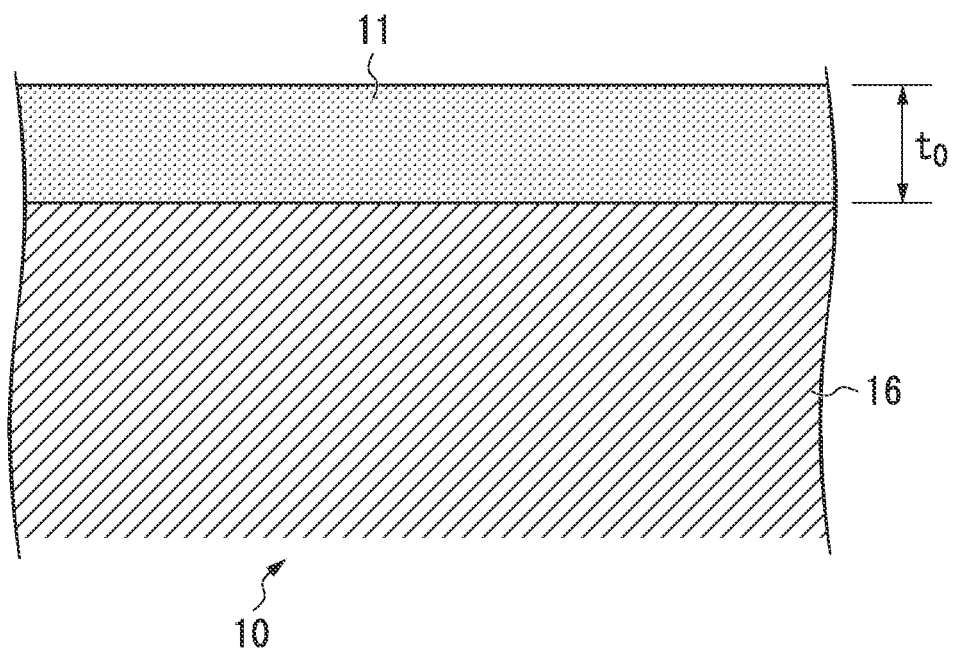
FIG. 2 is an enlarged cross-sectional view in the vicinity of the surface of the silicon member shown in FIG. 1.
Figure 3:
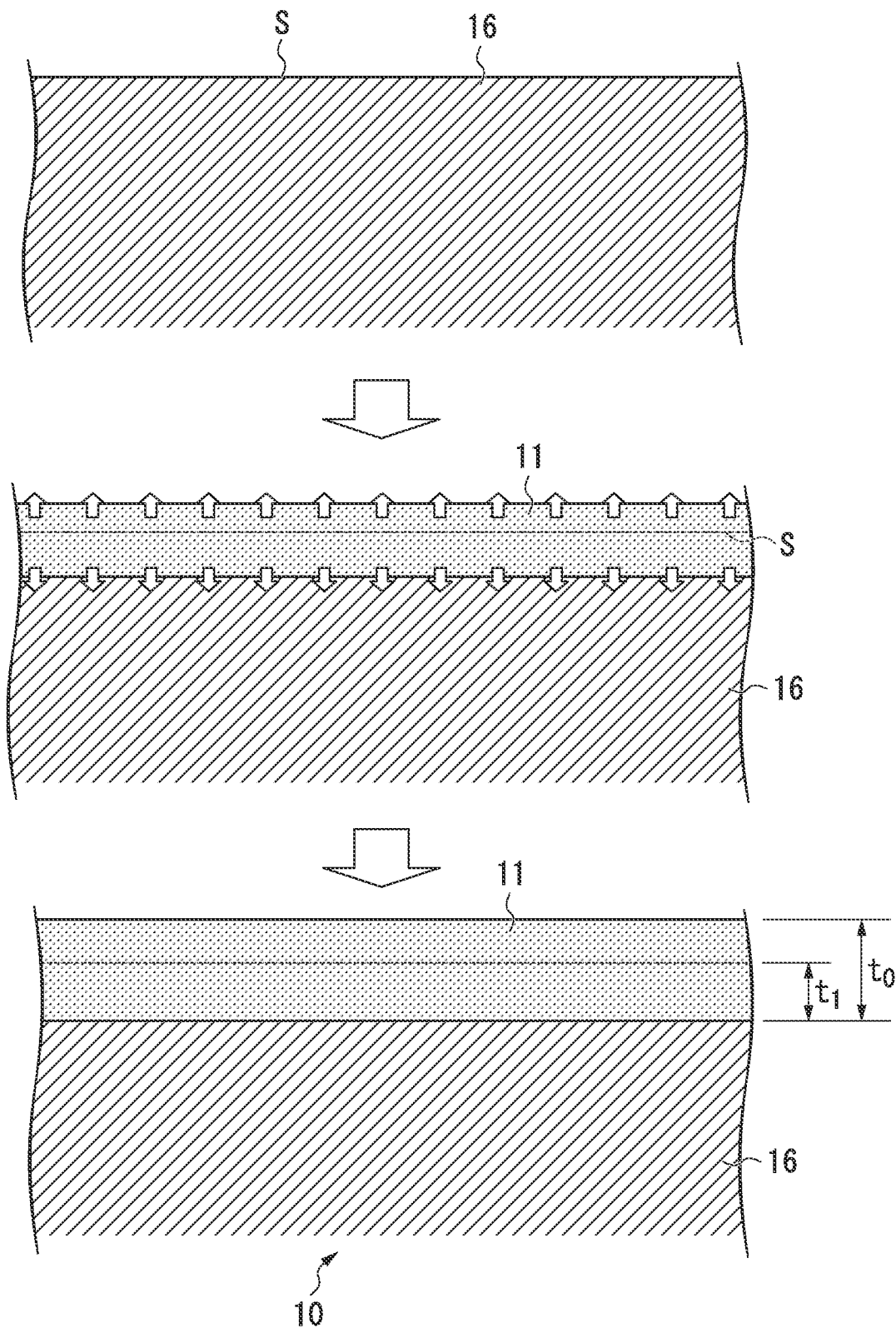
FIG. 3 is an explanatory diagram of the method of producing the silicon member of the first embodiment of the present invention.

The silicon member of the first embodiment of the present invention is explained in reference to FIGS. 1 to 3.

The silicon member 10 of the present embodiment is in the plate shape as shown in FIG. 1 and used as the holding plate that holds the liquid crystal panel during the heat treatment process in the liquid crystal panel production. In the present embodiment, the silicon member 10 is the large-sized plate material with the dimension: width W being 500 mm to 1500 mm; length L being 500 mm to 1500 mm; and thickness H being 5 mm to 50 mm.

As shown in FIG. 2, the coating layer composed of the product of silicon is formed on the surface of the silicon member 10. In the present embodiment, the silicon oxide film 11 is formed as the coating layer.

The thickness $t_0$ of the silicon oxide film 11 (coating layer) is in the range of 15 nm≤$t_0$≤600 nm. Preferably, it is in the range of 30 nm≥$t_0$≥520 nm.

The silicon member 10 is produced by following the processes described below.

First, a single-crystalline silicon ingot, a pseudo-single-crystalline silicon ingot, or a poly-crystalline silicon ingot, which will be the raw material of the silicon member 10, is prepared.

The single-crystalline silicon ingot that will be the raw material of the silicon member 10 is manufactured by the Czochralski CZ method.

Figure 7:
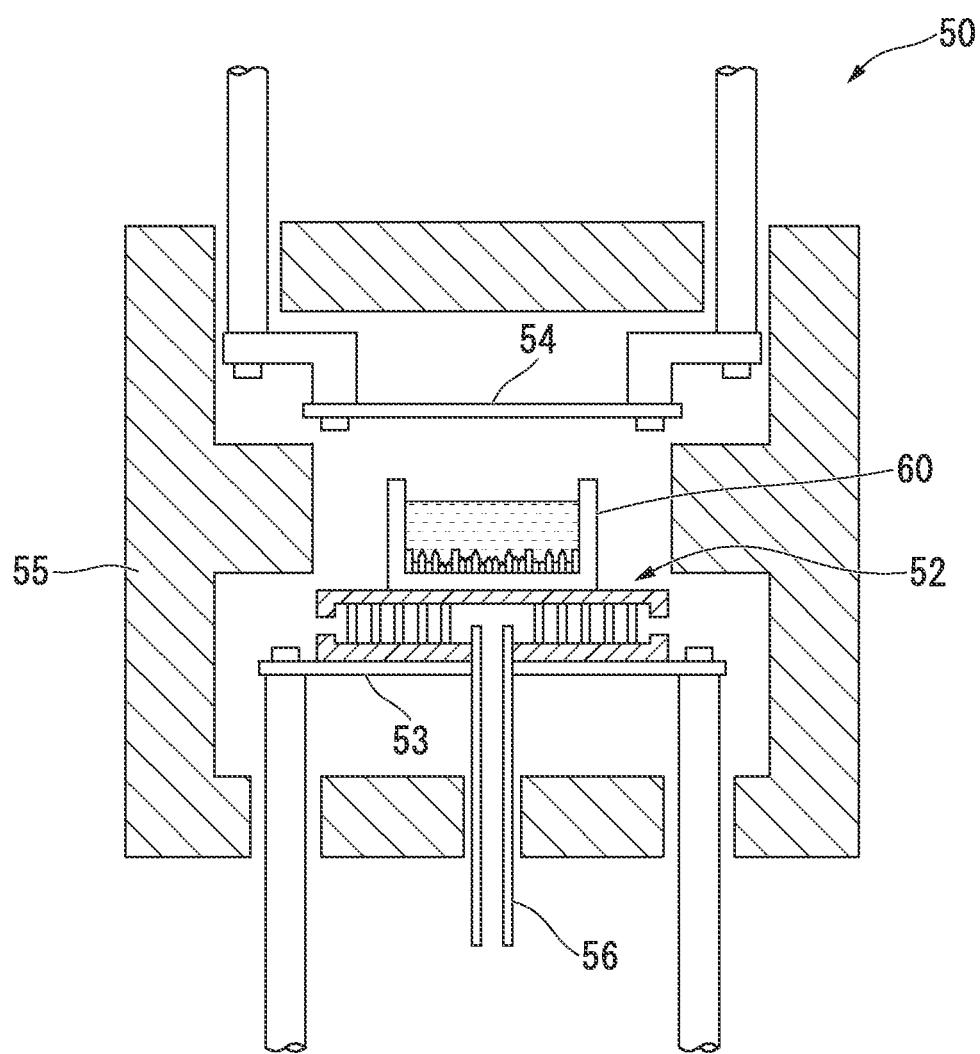
FIG. 7 is a schematic diagram of the columnar crystal silicon ingot manufacturing apparatus 50 used for producing the pseudo-single-crystalline silicon ingot or the poly-crystalline silicon ingot, which is the material of the silicon member of the embodiments of the present invention.

Also, the pseudo-single-crystalline silicon ingot and the poly-crystalline silicon ingot that will be the raw material of the silicon member 10 are manufactured by using the columnar crystal silicon ingot manufacturing apparatus 50 shown in FIG. 7.

The columnar crystal silicon ingot manufacturing apparatus 50 includes: a crucible 60 storing the silicon melt L; a chill plate 52 on which the crucible 60 is placed; an under the floor heater 53 supporting the chill plate 52 from the lower side; and the ceiling heater 54 provided above the crucible 60. Also, an insulating material 55 is provided around the crucible 60.

The chill plate 52 is in a hollowed-structure, and it is configured that Ar gas is supplied to the inside of the chill plate 52 through a supply pipe 56.

The columnar crystal silicon ingot is produced by solidifying the silicon melt upward from the bottom part of the crucible 60 by: inserting the silicon raw materials in the crucible 60 of the above-described columnar crystal silicon ingot manufacturing apparatus 50; producing the silicon melt by heating and dissolving them; and adjusting outputs of the under the floor heater 53 and the ceiling heater 54.

The pseudo-single-crystalline silicon ingot is produced by growing each of single crystals from multiple seed crystals in the crucible 60 by solidifying silicon melt upward from the bottom part of the crucible 60 by: placing the multiple seed crystals made of single-crystalline silicon plates on the bottom part of the crucible 60 of the above-described columnar crystal silicon ingot manufacturing apparatus 50; inserting the silicon raw materials in the crucible 60; producing the silicon melt by heating and dissolving them; and adjusting outputs of the under the floor heater 53 and the ceiling heater 54. The pseudo-single-crystalline silicon ingot is the silicon ingot having multiple single-crystalline pails grown from the seed crystals. Depending on the way to arrange the seed crystals, it is possible for the entire body of the silicon ingot to be almost single-crystalline.

Next, the single-crystalline silicon ingot, the pseudo-single-crystalline silicon ingot, or the poly-crystalline silicon ingot is sawed with the band saw or the wire saw to excise the plate material 16 in a predetermined size out.

Next, the surface of the excised plate material 16 is grinded and polished. Then, etching treatment is performed. In the present embodiment, the mixed solution of hydrofluoric acid and nitric acid is used as the etching liquid. Because of the treatment, the strained-layer existing in the surface layer of the plate material 16 is removed.

Then, oxidation treatment is performed on the plate material 16. The silicon oxide film 11 (coating layer) is formed by oxidizing silicon on the surface of the plate material 16 by: inserting the plate material 16 in a vacuum container; heating it to a predetermined temperature; and introducing an oxidized gas into the vacuum container. The thickness $t_0$ of the silicon oxide film 11 (coating layer) can be controlled by adjusting the temperature and the flow rate of the gas during the oxidation treatment.

At this time, there are scratches and micro-cracks on the surface of the plate material 16. By oxidation treating the surface to firm the silicon oxide film 11, the silicon oxide film 11 grows (penetrates) even toward the internal side of the plate material 16 as shown in FIG. 3, and the previously existing scratches and micro-cracks are eliminated. More specifically, oxygen in the silicon oxide film 11 diffuses in the solid state body, and diffuses to the part corresponding to the plate material 16 (in the downward direction in FIG. 3). When the diffused oxygen reacts with silicon of the plate material 16 existing under the diffused location, the silicon oxide film 11 grows (penetrates) toward the internal side of the plate material 16.

In the present embodiment, the $t_1$ (penetration depth $t_1$ into silicon), which is the thickness of the silicon oxide film 11 grown toward the internal side of the plate material 16 from the surface S of the plate material 16 before the formation of the silicon oxide film 11, with respect the entire thickness $t_0$ of the silicon oxide film 11, is set to satisfy the formula, $t_1=0.45 \times t_0$, as shown in FIG. 3.

The silicon member 10 of the present embodiment configured as described above is used as the holding plate for the liquid crystal panel and heated to the high temperature such as 600° C. to 800° C. during the heat treatment process.

According to the silicon member 10 of the present embodiment configured as described above, the scratches and micro-cracks on the surface are eliminated in the process that the silicon oxide film 11 (coating layer) is formed, since it has the silicon oxide film 11 (coating layer) formed by oxidizing silicon on the surface of the plate material 16 on its surface. Thus, cracking originated from the scratches and micro-cracks can be suppressed. Because of this, cracking due to thermal stress or the like can be suppressed even if the large-sized and plate-shaped silicon member 10, which has the dimension of: width W being 500 mm to 1500 mm; length L being 500 mm to 1500 mm; and thickness H being 5 mm to 50 mm, is used in the high-temperature condition.

Also, in the present embodiment, the thickness $t_0$ of the silicon oxide film 11 (coating layer) is set to be 15 nm or more. Thus, the scratches and micro-cracks on the surface can be eliminated and occurrence of cracking can be suppressed reliably. Furthermore, the thickness $t_0$ of the silicon oxide film 11 (coating layer) is set to be 600 nm or less. Thus, the lapse time for the oxidation treatment can be shortened, and the silicon member 10 can be produced efficiently.

When the thickness $t_0$ of the silicon oxide film 11 (coating layer) is set to be 30 nm or more, the scratches and micro-cracks on the surface can be eliminated more sufficiently and occurrence of cracking can be suppressed reliably. Also, when the thickness $t_0$ of the silicon oxide film 11 (coating layer) is set to be 520 nm or less, the lapse time for the oxidation treatment can be shortened further, and the silicon member 10 can be produced efficiently.

In addition, in the present embodiment, the $t_1$ (penetration depth $t_1$ into silicon), which is the thickness of the silicon oxide film 11 grown toward the internal side of the plate material 16 from the surface S of the plate material 16 before the formation of the silicon oxide film 11, with respect the entire thickness $t_0$ of the silicon oxide film 11, is set to satisfy the formula, $t_1=0.45 \times t_0$. Therefore, the scratches and micro-cracks can be eliminated reliably by forming the silicon oxide film 11 (coating layer).

Figure 4:
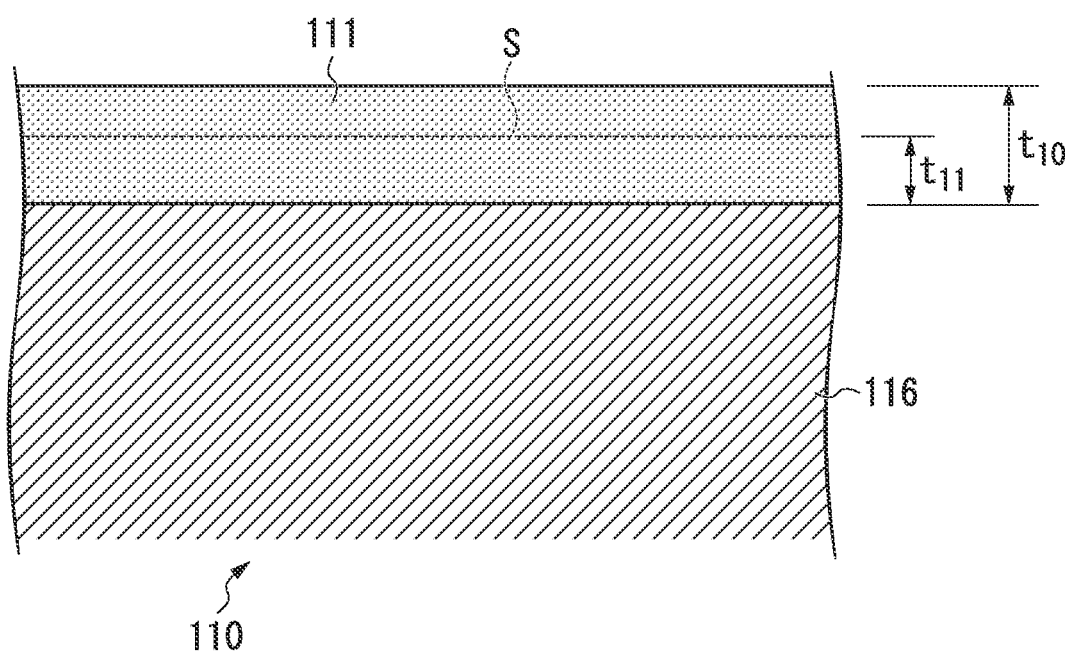
FIG. 4 is an enlarged cross-sectional view in the vicinity of the silicon member of the second embodiment of the present invention.

Next, the silicon member 110 of the second embodiment of the present invention is explained in reference to FIG. 4.

In the second embodiment, the coating layer formed on the surface of the silicon member 110 is the silicon nitride film 111. The thickness $t_{10}$ of the silicon nitride film 111 (coating layer) is set to satisfy the formula, 15 nm≤$t_{10}$≤50 nm.

The silicon nitride film 111 (coating layer) is formed by performing the thermal nitridation treatment on the surface of the silicon plate material 116. The $t_{11}$ (penetration depth $t_{11}$ into silicon), which is the thickness of the silicon nitride film 111 grown toward the internal side of the plate material 116 from the surface S of the plate material 116 before the formation of the silicon nitride film 111, with respect the entire thickness $t_{10}$ of the silicon nitride film 111, is set to satisfy the formula, $t_{11}=0.88 \times t_{10}$, as shown in FIG. 4.

According to the silicon member 110 of the present embodiment configured as described above, the scratches and micro-cracks on the surface are eliminated in the process that the silicon nitride film 111 (coating layer) is formed, since it has the silicon nitride film 111 (coating layer) formed by nitriding silicon on the surface of the plate Material 116 on its surface. Thus, cracking originated from the scratches and micro-cracks can be suppressed.

Also, in the present embodiment, the thickness $t_{10}$ of the silicon nitride film 111 (coating layer) is set to be 15 nm or more. Thus, the scratches and micro-cracks on the surface can be eliminated and occurrence of cracking can be suppressed reliably. Furthermore, the thickness $t_{10}$ of the silicon nitride film 111 (coating layer) is set to be 50 nm or less. Thus, the lapse time for the nitridation treatment can be shortened, and the silicon member 110 can be produced efficiently.

In addition, in the present embodiment, the $t_{11}$ (penetration depth $t_{11}$ into silicon), which is the thickness of the silicon nitride film 111 grown toward the internal side of the plate material 116 from the surface S of the plate material 116 before the formation of the silicon nitride film 111 with respect the entire thickness $t_{10}$ of the silicon nitride film 111, is set to satisfy the formula, $t_{11}=0.88 \times t_{10}$. Therefore, the scratches and micro-cracks can be eliminated reliably by forming the silicon nitride film 111 (coating layer).

Figure 5:
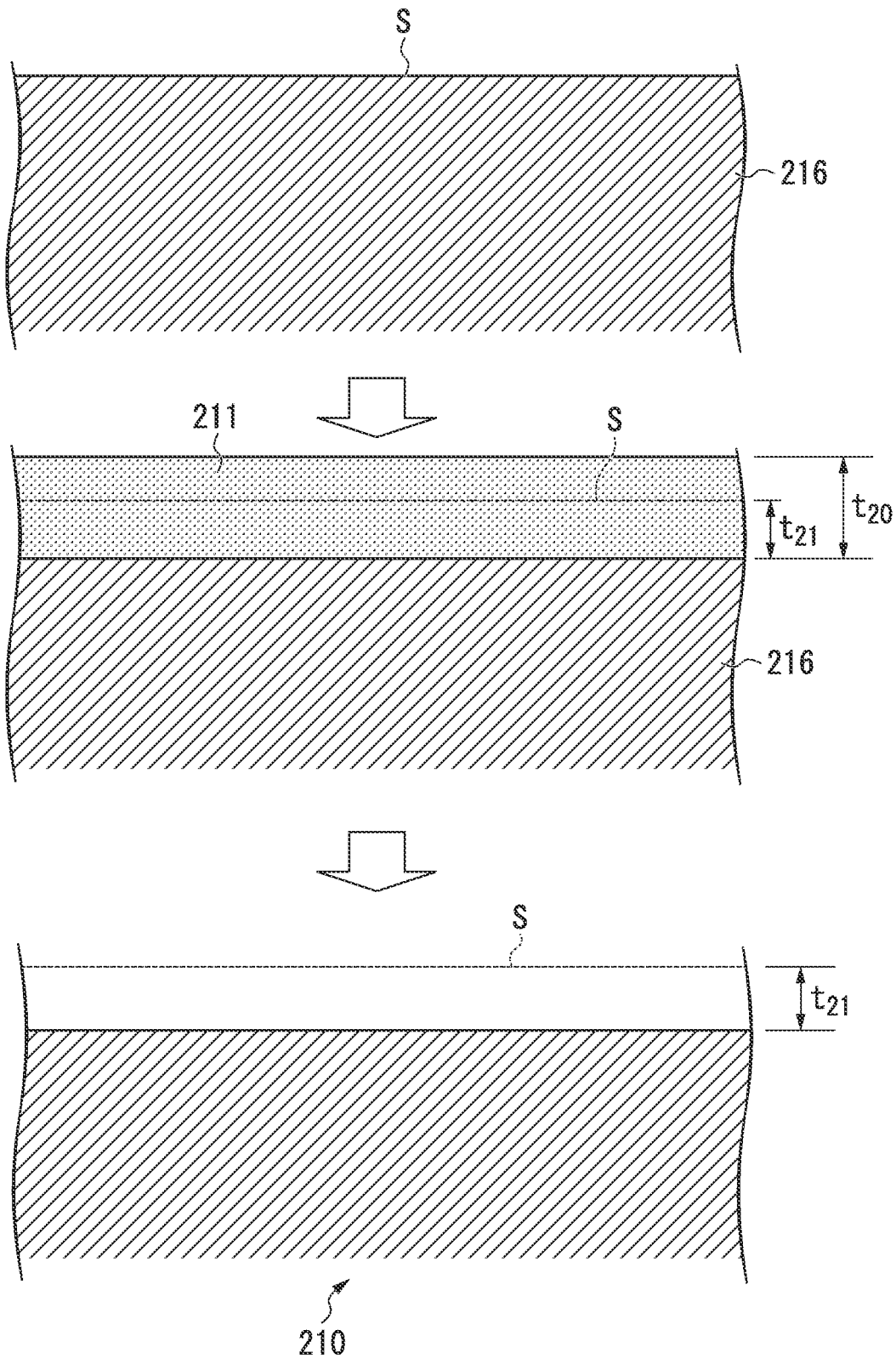
FIG. 5 is an explanatory diagram of the method of producing the silicon member of the third embodiment of the present invention.

Next, the silicon member of the third embodiment of the present invention is explained in reference to FIG. 5.

In the third embodiment, it is configured that after forming the coating layer composed of the silicon oxide film 211 on the surface of the silicon member 210, silicon is exposed by removing the silicon oxide film 211 (coating layer) as shown in FIG. 5. When the silicon oxide film is thick, it is polished while a part of the silicon oxide layer is still left, and the remaining silicon oxide film layer is removed by a buffered hydrofluoric acid solution. In the case of the silicon oxide film being thin, it is removed directly by the buffered hydrofluoric acid solution. Removal of the silicon oxide film layer by the buffered hydrofluoric acid solution can be performed by using a solution of the composition of $HF:NH_4F=7:1$ at the room temperature.

The silicon oxide film 211 formed on the surface of the plate material 216 grows even toward the internal side of the plate material 216, and the scratches and micro-cracks previously existed on the surface of the plate material 216 are eliminated.

In the present embodiment, the $t_{21}$ (penetration depth $t_{21}$ into silicon), which is the thickness of the silicon oxide film 211 grown toward the internal side of the plate material 216 from the surface S of the plate material 216 before the formation of the silicon oxide film 211, with respect the entire thickness $t_{20}$ of the silicon oxide film 211, is set to satisfy the formula, $t_{21}=0.45 \times t_{20}$, as shown in FIG. 5.

Then, since the silicon oxide film 211 is removed later on, the part corresponding to the thickness $t_{21}$ is removed from the surface S of the original plate material 216 in the silicon member 210 of the present embodiment.

In the silicon member 210 in this configuration, the silicon oxide film 211 (coating layer) is formed by oxidizing the silicon on the surface of the plate material 216. Thus, fine scratches and micro-cracks on the surface are eliminated during the formation of the silicon oxide film 211 (coating layer). Then, since this silicon oxide film 211 (coating layer) is removed later on, the silicon member 210 free of the scratches and micro-cracks can be obtained. Furthermore, contamination of impurities, such as oxygen, nitrogen, or the like, to other members during heat treatment can be suppressed.

In addition, new silicon oxide film or silicon nitride film can be re-formed on the surface of the silicon member 210 since the other members will not be contaminated by the impurities such as oxygen, nitrogen, or the like at 300° C. to 900° C., which is a temperature range of a low heat treatment temperature. The coating layer on the surface layer prevents formation of scratches, and also eliminates micro-scratches formed after removal of the old coating layer. Thus, cracking originated from these scratches and micro-cracks can be suppressed.

Figure 6:
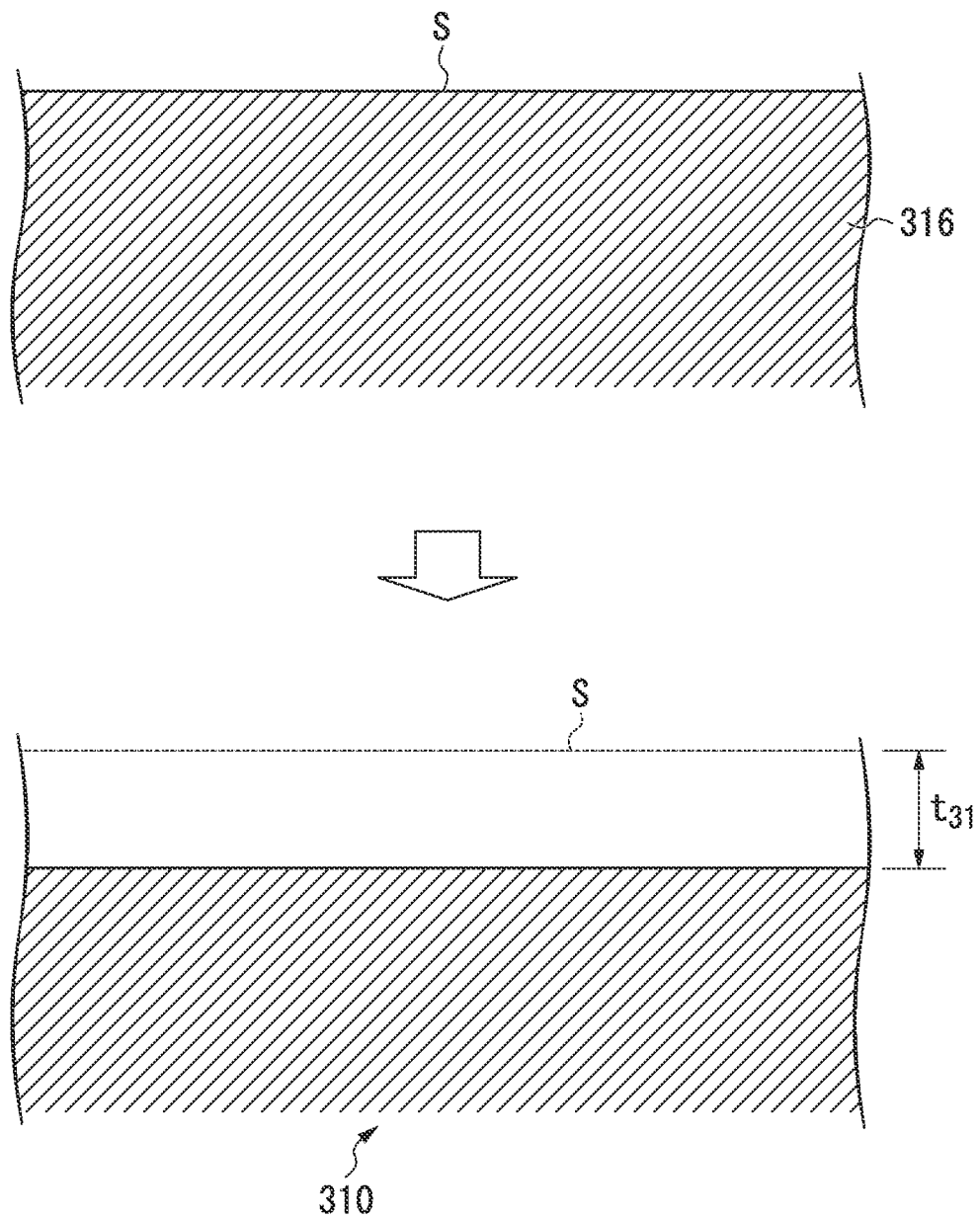
FIG. 6 is an explanatory diagram of the method of producing the silicon member of the fourth embodiment of the present invention.

Next, the silicon member of the fourth embodiment of the present invention is explained in reference to FIG. 6.

In the fourth embodiment, the surface of the plate material 316 is polished and then the etching treatment is performed as shown in FIG. 6, to remove the scratches and micro-cracks on the surface. Then, the arithmetic average roughness Ra of the surface is set to be 2 nm or less.

In the present embodiment, the part corresponding to the thickness $t_{31}$ is removed from the surface S of the original plate material 316 by the polishing and the etching treatment. The thickness of $t_{31}$ is set in the range to satisfy the formula, 100 nm≤$t_{31}$≤5000 nm.

In the silicon member 310 configured as described above, the silicon member 310 with a smaller number of scratches and micro-cracks can be obtained since the scratches and micro-cracks on the surface are removed and the arithmetic average roughness Ra of the surface is set to be 2 nm or less by: polishing the surface of the silicon member 310; and performing the etching treatment afterward. Moreover, contamination of impurities such as oxygen, nitrogen, or the like to the other members during the heat treatment can be suppressed. Also, the scratches and micro-cracks can be eliminated reliably in the present embodiment since the thickness $t_{31}$ removed by the polishing and the etching treatment is set to be in the range to satisfy the formula, 100 nm≤$t_{31}$≤5000 nm.

The silicon members of the embodiments of the present invention are explained above. However, the scope of the present invention is not restricted by the descriptions of the embodiments and the configurations can be modified as needed.

For example, the embodiments are explained referring the silicon member in the plate shape as shown in FIG. 1. The scope of the present invention is not restricted by the description, and the silicon member can be the silicon ring material, silicon disc material, silicon plate material, or the like placed in the semiconductor manufacturing apparatus, and the silicon rectangular pillar material, silicon bar material, silicon bulk material, or the like used in the heat treatment apparatus.

EXAMPLE

Results of confirmatory experiments performed to confirm the effects of the present invention are shown.

The silicon members (silicon plate) of Examples 1-21 of the present invention and those of Comparative examples 1-2 were produced by following the procedures described below. Then, the measurement of surface roughness (arithmetic average roughness Ra) and the four-point bending test were performed on the obtained silicon members.

Examples 1-8 of the Present Invention

Plate materials, which had the dimension of 1000 mm×1000 mm×20 mm (width×length×thickness), were excised from the poly-crystalline silicon ingot (unidirectionally solidified columnar crystal ingot), which had the dimension of 1000 mm×1000 mm×30 mm (width×length×height), with a band saw.

Next, both sides of the plate materials were etched by the mixed solution of hydrofluoric acid and nitric acid after polishing the both sides of the plate materials with a polishing machine. Then, they were washed with pure water thoroughly.

The obtained plate materials were inserted in the oxidation furnace. The silicon oxide films shown in Table 1 were formed on the silicon plates by retaining them for the lapse time shown Table 1 at 900° C. by wet oxidation (pyrogenic oxidation).

Examples 9-10 of the Present Invention

Plate materials, which had the dimension of 1000 mm×1000 mm×20 mm (width×length×thickness), were excised from the pseudo-single-crystalline silicon ingot (unidirectionally solidified columnar crystal ingot using seed crystals), which had the dimension of 1000 mm×1000 mm×300 mm (width×length×height), with a band saw.

Next, both sides of the plate materials were etched by the mixed solution of hydrofluoric acid and nitric acid after polishing the both sides of the plate materials with a polishing machine. Then, they were washed with pure water thoroughly.

The obtained plate materials were inserted in the oxidation furnace. The silicon oxide films shown in Table 1 were formed on the silicon plates by retaining them for the lapse time shown Table 1 at 900° C. by wet oxidation (pyrogenic oxidation).

Example 11 of the Present Invention

A plate material, which had the dimension of 1000 mm×1000 mm×20 mm (thickness), was excised from the pseudo-single-crystalline silicon ingot (unidirectionally solidified columnar crystal ingot using seed crystals), which had the dimension of 1000 mm×1000 mm×300 mm (height), with a band saw.

Next, both sides of the plate material were etched by the mixed solution of hydrofluoric acid and nitric acid after polishing the both sides of the plate material with a polishing machine. Then, it was washed with pure water thoroughly.

The obtained plate material was inserted in the heat treatment furnace. The silicon nitride film with the thickness of 15 nm was formed on the silicon plates by retaining it for 90 minutes at 1050° C. while ammonia was flowed into the furnace.

Example 12 of the Present Invention

Using the silicon plate of the above-described Example 5 of the present invention, the silicon oxide film formed on the silicon plate was removed. Removal of the silicon oxide film was performed at the room temperature for 2 minutes using the mixed acid solution with the composition: hydrofluoric acid (48%):nitric acid (70%):pure water=3:2:6.

Example 13 of the Present Invention

Using the silicon plate of the above-described Example 5 of the present invention, the silicon oxide film formed on the silicon plate was removed. Removal of the silicon oxide film was performed at the room temperature for 1 minute 30 seconds using the mixed acid solution with the composition: hydrofluoric acid (48%):nitric acid (70%):pure water=3:2:6. Then, the remaining silicon oxide film was removed by treating it with the buffered hydrofluoric acid solution for 30 minutes at the room temperature.

Examples 14-15 of the Present Invention

Using the silicon plate of the above-described Example 9 of the present invention, the silicon oxide films firmed on the silicon plates were removed. Removal of the silicon oxide films was performed at the room temperature for 1 minute 30 seconds using the mixed acid solution with the composition: hydrofluoric acid (48%):nitric acid (70%):pure water=3:2:6. Then, the remaining silicon oxide films were removed by treating it with the buffered hydrofluoric acid solution for 30 minutes at the room temperature.

Examples 16-17 of the Present Invention

The silicon plates of the above-described Example 13 of the present invention were inserted in the oxidation furnace. The silicon oxide films shown in Table 2 were formed on silicone plates by retaining them for the lapse time shown Table 2 at 900° C. by wet oxidation (pyrogenic oxidation).

Examples 18-19 of the Present Invention

The silicon plates of the above-described Example 15 of the present invention were inserted in the oxidation furnace. The silicon oxide films shown in Table 2 were formed on the silicon plates by retaining them for the lapse time shown Table 2 at 900° C. by wet oxidation (pyrogenic oxidation).

Example 20 of the Present Invention

Using the silicon plate of the above-described Example 1 of the present invention, the silicon oxide film formed on the silicon plate was removed. Removal of the silicon oxide film was performed at the room temperature using the buffered hydrofluoric acid solution. Then, the obtained plate material was inserted in the heat treatment furnace. The silicon nitride film with the thickness of 15 nm was formed on the silicon plates by retaining it for 90 minutes at 1050° C. while ammonia was flowed into the furnace.

Example 21 of the Present Invention

Plate materials, which had the dimension of 1000 mm×1000 mm×20 mm (width×length×thickness), were excised from the poly-crystalline silicon ingot (unidirectionally solidified columnar crystal ingot), which had the dimension of 1000 mm×1000 mm×300 mm (width×length×height), with a band saw.

After polishing the both sides of the plate materials with a polishing machine, both sides of the plate materials were etched by the mixed acid solution with the composition: hydrofluoric acid (48%):nitric acid (70%):pure water=3:2:6. By these polishing and the etching treatment, the portion of the surface of the plate material was removed to the thickness of 5 μm.

Comparative Example 1

A plate material, which had the dimension of 1000 mm×1000 mm×20 mm (width×length×thickness), were excised from the poly-crystalline silicon ingot (unidirectionally solidified columnar crystal ingot), which had the dimension of 1000 mm×1000 mm×300 mm (width×length×height), with a band saw. Then, the both sides of the plate material were grinded by a grinding machine.

Comparative Example 2

A plate material, which had the dimension of 1000 mm×1000 mm×20 mm (width×length×thickness), were excised from the poly-crystalline silicon ingot (unidirectionally solidified columnar crystal ingot), which had the dimension of 1000 mm×1000 mm×300 mm (width×length×height), with a band saw. Then, the both sides of the plate material were polished by a polishing machine.

[Thickness of the Silicon Oxide Film and the Silicon Nitride Film]

Thicknesses of the obtained silicon oxide films and the obtained silicon nitride films in Examples 1-11 and 16-20 of the present invention were measured. Also, the thickness of growth of the formed film from the surface of the plate material before the film formation toward the internal side of the plate material (penetration depth) was evaluated based on calculation. The thickness of the silicon oxide films and the silicon nitride films was measured with a spectroscopic ellipsometer. When $t_0$ is defined as the total thickness of the silicon oxide film, it is understood that the silicon oxide film grew by the amount of $t_1=0.45 \times t_0$ toward the internal side based on the density and the molecular weight of Si and $SiO_2$. When $t_0$ is defined as the total thickness of the silicon nitride film, it is understood that the silicon nitride film grew by the amount of $t_{11}=0.88 \times t_{10}$ toward the internal side based on the density and the molecular weight of Si and $Si_3N_4$. The measurement results are shown in Tables 1 and 2.

[Surface Roughness Ra]

The surface roughnesses in Examples 1-21 of the present invention and Comparative example 2 were measured with an AFM (Atomic. Force Microscope).

The surface roughness in Comparative example 1 was measured with the Dektak surface roughness meter (10 μm scan).

The measurement results are shown in Tables 1 and 2.

[Four-Point Bending Test]

The four-point bending test was performed on the obtained testing materials. The four-point bending test was performed based on the JIS R1601 standard. The testing materials had the sample size of length being 40 mm; width being 4 mm; and thickness being 3 mm. The measurement results are shown in Tables 1 and 2.

TABLE 1

| | Crystal type | | Film forming time hr | Film thickness nm | Penetration depth nm | Maximum load in four-point bending MPa | Surface roughness Ra nm | Measurement method 4 μm☐(sq.) |
|---|---|---|---|---|---|---|---|---|
| Example 1 of the present invention | Columnar crystal | Oxide film | 0.15 | 30 | 14 | 195 | 0.3 | AFM |
| Example 2 of the present invention | Columnar crystal | Oxide film | 0.25 | 45 | 20 | 200 | 0.3 | AFM |
| Example 3 of the present invention | Columnar crystal | Oxide film | 0.5 | 80 | 36 | 207 | 0.5 | AFM |
| Example 4 of the present invention | Columnar crystal | Oxide film | 1 | 150 | 68 | 212 | 0.7 | AFM |
| Example 5 of the present invention | Columnar crystal | Oxide film | 2 | 250 | 113 | 220 | 1 | AFM |
| Example 6 of the present invention | Columnar crystal | Oxide film | 4 | 420 | 189 | 239 | 1.2 | AFM |
| Example 7 of the present invention | Columnar crystal | Oxide film | 6 | 520 | 234 | 252 | 1.3 | AFM |
| Example 8 of the present invention | Columnar crystal | Oxide film | 8 | 600 | 270 | 248 | 1.5 | AFM |
| Example 9 of the present invention | Pseudo-single crystal | Oxide film | 2 | 255 | 115 | 240 | 0.4 | AFM |
| Example 10 of the present invention | Pseudo-single crystal | Oxide film | 6 | 515 | 232 | 265 | 0.7 | AFM |
| Example 11 of the present invention | Columnar crystal | Nitride film | 1.5 | 15 | 13 | 203 | 0.8 | AFM |

TABLE 2

| | Crystal type | | Film forming time hr | Film thickness nm | Penetration depth nm | Maximum load in four-point bending MPa | Surface roughness Ra nm | Measurement method 4 μm☐(sq.) |
|---|---|---|---|---|---|---|---|---|
| Example 12 of the present invention | Columnar crystal | Oxide film Removed | — | — | — | 215 | 0.8 | AFM |

TABLE 2-continued

| | Crystal type | | Film forming time hr | Film thickness nm | Penetration depth nm | Maximum load in four-point bending MPa | Surface roughness Ra nm | Measurement method 4 μm□(sq.) |
|---|---|---|---|---|---|---|---|---|
| Example 13 of the present invention | Columnar crystal | Oxide film Removed | — | — | — | 224 | 0.7 | AFM |
| Example 14 of the present invention | Pseudo-single crystal | Oxide film Removed | — | — | — | 215 | 0.5 | AFM |
| Example 15 of the present invention | Pseudo-single crystal | Oxide film Removed | — | — | — | 221 | 0.3 | AFM |
| Example 16 of the present invention | Columnar crystal | Oxide film Reformed | 0.15 | 28 | 13 | 225 | 0.8 | AFM |
| Example 17 of the present invention | Columnar crystal | Oxide film Reformed | 0.25 | 45 | 20 | 227 | 0.7 | AFM |
| Example 18 of the present invention | Pseudo-single crystal | Oxide film Reformed | 0.15 | 30 | 14 | 244 | 0.5 | AFM |
| Example 19 of the present invention | Pseudo-single crystal | Oxide film Reform | 0.25 | 44 | 20 | 248 | 0.5 | AFM |
| Example 20 of the present invention | Columnar crystal | Oxide film Removed Nitride film Reformed | 1.5 | 15 | 13 | 205 | 0.8 | AFM |
| Example 21 of the present invention | Columnar crystal | Polishing + Etching | — | — | — | 188 | 0.2 | AFM |
| Comparative example 1 | Columnar crystal | Grinding | — | — | — | 30 | 50 | 10 μm Scan with Dektak |
| Comparative example 2 | Columnar crystal | Polishing | — | — | — | 154 | 0.9 | AFM |

In Comparative example 1, where the surface of the silicon plate was grinded, the calculated average roughness of the surface Ra was 50 μm, and the maximum load in the four-point bending test was 30 MPa, which was a low value, meaning the silicon member of Comparative example 1 is prone to be cracked easily.

Also, in Comparative example 2, where the surface of the silicon plate was polished, the calculated average roughness of the surface Ra was 0.9 μm, and the maximum load in the four-point bending test was 154 MPa. There was an improvement compared to Comparative example 1. However, the silicon member of Comparative example 2 was still prone to be cracked easily.

Contrary to that, in Examples 1-21 of the present invention, the maximum loads in the four-point bending test were even higher, confirming that cracking was suppressed. Particularly, in Examples 1-11 and 16-19 of the present invention, where the silicon oxide films or the silicon nitride films were formed, results in the four-point bending test were good regardless of the surface roughness. Moreover, in Examples 9-10, and 18-19 of the present invention, results in the surface roughness and the four-point bending test were good.

Based on the results explained above, it was confirmed that the silicon member, in which cracking is suppressed even if it is used in the condition where the silicon member is heated, can be provided according to Examples of the present invention.

BRIEF DESCRIPTION OF THE REFERENCE SYMBOLS

10, 110, 210, 310: Silicon member
11: Silicon oxide film (coating layer)
111: Silicon nitride film (coating layer)
16, 116, 216, 316: Plate material

What is claimed is:

1. A method of producing a holding plate for a liquid crystal panel in deposition and heat treatment that is used in a condition where the holding plate is heated at a temperature ranged from 300°C. to 1100°C., the method comprising steps of:
  excising a large-sized plate material made of a polycrystalline silicon or a pseudosingle-crystalline silicon from a unidirectionally solidified columnar crystal ingot;
  forming a coating layer composed of a product of silicon formed by reaction of the silicon on a surface of the large-sized plate material which has micro-cracks on the surface before forming the coating layer, wherein
  the large-sized plate material has the dimension: width W being 500 mm to 1500 mm; length L being 500 mm to 1500 mm; and thickness H being 5 mm to 50 mm,
  the step of forming the coating layer comprises the steps of:
    forming a silicon oxide film on the surface of the large-sized plate material in a furnace by pyrogenic oxidation;
    removing the silicon oxide film from the large-sized plate material using a buffered hydrofluoric acid solution; and
    forming a silicon nitride film on the surface of the large-sized plate material as the coating layer while flowing ammonia into the furnace; wherein
    a thickness of the coating layer, $t_{10}$, is 15 nm or more and 50 nm or less, and after forming the coating layer,
    the surface of the holding plate is free of scratches and micro-cracks,
    a maximum load in four-point bending of the holding plate is between 188-265 MPa, and
    a penetration depth, $t_{11}$, of the silicon nitride film into silicon on the surface toward an internal side of the large-sized plate material satisfies a formula $t_{11} \geq 0.88 \times t_{10}$ based on densities and molecular weights of Si and $Si_3N_4$, $t_{10}$ and $t_{11}$ being measured with a spectroscopic ellipsometer.

2. A method of producing a holding plate comprising steps of:
   excising a large-sized plate material made of a polycrystalline silicon or a pseudosingle-crystalline silicon from a unidirectionally solidified columnar crystal ingot;
   forming a coating layer composed of a product of silicon formed by reaction of the silicon on a surface of the large-sized plate material which has micro-cracks on the surface before forming the coating layer, wherein the large-sized plate material has the dimension: width W being 500 mm to 1500 mm; length L being 500 mm to 1500 mm; and thickness H being 5 mm to 50 mm,
   the step of forming the coating layer comprises the steps of:
   forming a silicon oxide film on the surface of the large-sized plate material in a furnace by pyrogenic oxidation;
   removing the silicon oxide film from the large-sized plate material using a buffered hydrofluoric acid solution; and
   forming a silicon nitride film on the surface of the large-sized plate material as the coating layer while flowing ammonia into the furnace.

3. The method according to claim 2, wherein a thickness of the coating layer, $t_{10}$, is 15 nm or more and 50 nm or less.

4. The method according to claim 2, wherein after forming the coating layer, the surface of the holding plate is free of scratches and micro-cracks.

5. The method according to claim 2, wherein after forming the coating layer, a maximum load in four-point bending of the holding plate is between 188-265 MPa.

6. The method according to claim 3, wherein after forming the coating layer, a penetration depth, $t_{11}$, of the silicon nitride film into silicon on the surface toward an internal side of the large-sized plate material satisfies a formula $t_{11} \geq 0.88 \times t_{10}$ based on densities and molecular weights of Si and $Si_3N_4$, $t_{10}$ and $t_{11}$ being measured with a spectroscopic ellipsometer.

* * * * *